US012366873B2

(12) United States Patent
Chinthu et al.

(10) Patent No.: US 12,366,873 B2
(45) Date of Patent: Jul. 22, 2025

(54) LOW DROP-OUT (LDO) REGULATOR CIRCUIT

(71) Applicant: GLOBALFOUNDRIES U.S. Inc., Malta, NY (US)

(72) Inventors: Siva K. Chinthu, Bangalore (IN); Suresh Pasupula, Andhra Pradesh (IN); Devesh Dwivedi, Bengaluru (IN); Kevin A. Batson, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 246 days.

(21) Appl. No.: 17/728,750

(22) Filed: Apr. 25, 2022

(65) Prior Publication Data

US 2023/0341881 A1 Oct. 26, 2023

(51) Int. Cl.
*G05F 1/575* (2006.01)
*G05F 1/565* (2006.01)
*G11C 5/14* (2006.01)

(52) U.S. Cl.
CPC .............. *G05F 1/575* (2013.01); *G05F 1/565* (2013.01); *G11C 5/147* (2013.01)

(58) Field of Classification Search
CPC . G05F 1/757; G05F 1/59; G05F 1/595; G05F 1/61; G05F 1/648; G05F 1/5735; G05F 1/573; G05F 1/571; G05F 1/569; G05F 1/567; G05F 1/562; G05F 1/561; G05F 1/56; G05F 1/565; G11C 5/147; G11C 5/14
See application file for complete search history.

(56) References Cited

U.S. PATENT DOCUMENTS

| 10,996,700 | B1* | 5/2021 | Tan | G05F 1/575 |
| 11,086,342 | B1* | 8/2021 | Kim | H03K 5/24 |
| 2020/0285260 | A1* | 9/2020 | Londak | G05F 1/565 |
| 2022/0197321 | A1* | 6/2022 | Tiagaraj | G05F 1/575 |

FOREIGN PATENT DOCUMENTS

WO 2015026503 2/2015

OTHER PUBLICATIONS

Hung-Chih Lin et al., "An Active-Frequency Compensation Scheme for CMOS Low-Dropout Regulators With Transient-Response Improvement," in IEEE Transactions on Circuits and Systems II: Express Briefs, vol. 55, No. 9, pp. 853-857, Sep. 2008, Abstract, 3 pages.
Feng Chen et al., "A Fast-Transient 500-mA Digitally Assisted Analog LDO With 30-μV/mA Load Regulation and 0.0073-ps FoM in 65-nm CMOS" in IEEE Journal of Solid-State Circuits, vol. 56, No. 2, pp. 511-520, Feb. 2021, Abstract, 3 pages.

* cited by examiner

*Primary Examiner* — Nguyen Tran
(74) *Attorney, Agent, or Firm* — David Cain; Andrew M. Calderon; Calderon Safran & Wright P.C.

(57) ABSTRACT

The present disclosure relates to semiconductor structures and, more particularly, to a LDO regulator circuit and methods of manufacture. The structure includes a comparator connected to a first transistor of a low drop-out (LDO) circuit; a second transistor connected to the first transistor; and a feedback loop connected to the first transistor and an output of the LDO circuit.

20 Claims, 4 Drawing Sheets

LOW DROP-OUT (LDO) REGULATOR CIRCUIT

BACKGROUND

The present disclosure relates to semiconductor structures and, more particularly, to a low drop-out (LDO) regulator circuit and methods of operation.

A low-drop out (LDO) regulator circuit in a magnetoresistive random-access memory (MRAM) or a resistive random-access memory (RRAM) has a high wake-up time of approximately 3.5 psec. However, the high wake-up time of approximately 3.5 μsec is not suitable for memory applications such as MRAM or RRAM, in which access time is required in nanoseconds. Therefore, the high wake-up time causes an incorrect data transfer in high-speed circuits such as MRAM or RRAM.

In conventional LDO regulator circuits, an output voltage wake-up time can be improved by increasing the power by increasing the bandwidth of an operational-amplifier. In particular, a PMOS pass transistor of a conventional LDO regulator circuit takes a higher wake-up time to reach a stable output voltage (i.e., approximately 1.2 volts) for all process, voltage, and temperature (PVT) corners.

SUMMARY

In an aspect of the disclosure, a structure comprises a comparator generating a pulse to drive a first transistor by sensing an output of a LDO circuit; and a second transistor connected to the first transistor such that a wake-up time of the second transistor is based on the pulse driving the transistor.

In an aspect of the disclosure, a structure comprises: a comparator connected to a first transistor of a low drop-out (LDO) circuit; a second transistor connected to the first transistor; and a feedback loop connected to the first transistor and an output of the LDO circuit.

In an aspect of the disclosure, a method comprises: generating a pulse by sensing an output of a low drop-out (LDO) circuit; driving a transistor by the generated pulse, and waking up a second transistor within a wake-up time which is based on the generated pulse driving the transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
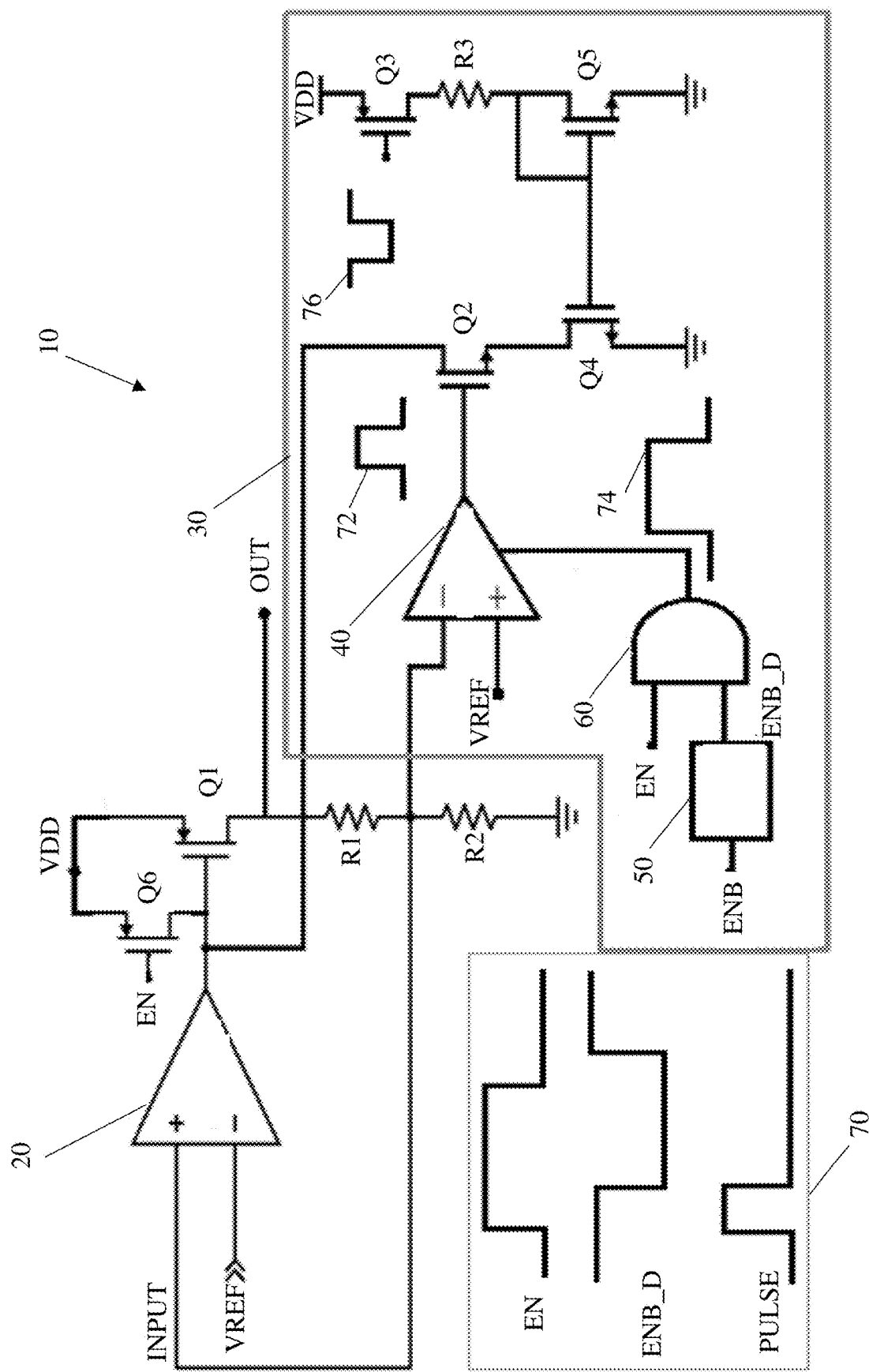
FIG. 1 shows a LDO regulator circuit with a pulse injection method in accordance with aspects of the present disclosure.

The present disclosure relates to semiconductor structures and, more particularly, to a low drop-out (LDO) regulator circuit and methods of operation. In embodiments, the LDO regulator circuit comprises a gate voltage of a pass transistor which is pulled to a low voltage (or a low power supply voltage VSS) with a current source (or transistor) by a voltage pulse during a wake-up time. In this operation, the pass transistor is turned on (e.g., waking up the pass transistor) quickly during a power up time (i.e., transient period) and turns off by the voltage pulse when an operational amplifier in the LDO regulator circuit is ready (e.g., the stable voltage of the LDO regulator circuit is reached).

In more specific embodiments, the LDO regulator circuit includes: a first transistor which is driven by a pulse; a comparator which generates the pulse to drive the first transistor by sensing an output of an LDO circuit; and a second transistor which is connected to the transistor such that a wake-up time of the second transistor is based on the pulse driving the transistor. In further embodiments, the operation of the circuit comprises: generating a pulse by sensing an output of a LDO circuit; driving a transistor by the generated pulse; and waking up a second transistor within a wake-up time which is based on the generated pulse driving the transistor. In further embodiments, a transistor of the LDO regulator circuit is connected between a gate of a pass transistor and a current sink/low power supply voltage VSS. Further, a gate of the transistor connected between the gate of the pass transistor and the current sink/low power supply voltage VSS is controlled by a delay pulse generated by a comparator.

Advantageously, the LDO regulator circuit improves a wake-up time (e.g., approximately 360 nanoseconds) and provides a faster response than know circuits by using a pulse generation method. Also, the implementation of the LDO regulator circuit uses an auxiliary digital circuit which consumes less power. In addition, the LDO regulator circuit can be used in different types of memories (e.g., MRAM and RRAM), high speed applications, mobile phones and accessories, portable cameras and video recorders, laptops, notebooks, and palm computers, amongst other many other electronic devices.

The LDO regulator circuit of the present disclosure may be manufactured in a number of ways using a number of different tools. In general, though, the methodologies and tools are used to form structures with dimensions in the micrometer and nanometer scale. The methodologies, i.e., technologies, employed to manufacture the LDO regulator circuit of the present disclosure have been adopted from integrated circuit (IC) technology. For example, the structures are built on wafers and are realized in films of material patterned by photolithographic processes on the top of a wafer. In particular, the fabrication of the photonic chip security structure uses three basic building blocks: (i) deposition of thin films of material on a substrate, (ii) applying a patterned mask on top of the films by photolithographic imaging, and (iii) etching the films selectively to the mask.

FIG. 1 shows a LDO regulator circuit with a pulse injection method in accordance with aspects of the present disclosure. In embodiments, the LDO regulator circuit structure 10 of FIG. 1 includes an operational amplifier 20, a wake-up time circuit 30, transistors Q1, Q6, and resistors R1, R2. Further, the wake-up time circuit 30 includes comparator 40, a delay block 50, AND gate 60, transistors Q2, Q3, Q4, Q5, and resistor R3. In embodiments, the transistors Q1, Q3, Q6 are PMOS transistors and Q2, Q4, Q5 are NMOS transistors.

In FIG. 1, the operational amplifier 20 receives a voltage reference signal VREF and an INPUT signal from the feedback net of the operational amplifier 20. The operational amplifier 20 amplifies a difference between the voltage reference signal VREF and the signal from the feedback net of the operational amplifier 20, and outputs the amplified difference to a gate of the transistor Q1 and a drain of the transistor Q6. The transistor Q6 has a gate connected to an enabled signal EN and a source connected to a high power supply voltage VDD. The transistor Q1 has a source connected to the high power supply voltage VDD and a drain connected to the output OUT. The resistors R1, R2 are connected between the drain of the transistor Q1 and the low power supply voltage VSS.

Still referring to FIG. 1, the delay block 50 receives an enabled signal ENB, delays the enabled signal ENB, and outputs a delayed enabled signal ENB_D to AND gate 60. The AND gate 60 also receives the enable signal EN. The AND gate 60 outputs a "1" when both the delayed enabled signal ENB_D and the enable signal EN are "1". The output of the AND gate 60 has a pulse 74 of approximately 400 nanoseconds. The output of the AND gate 60 is input to the comparator 40 to enable the comparator 40 when the output of the AND gate 60 is "1". Further, the comparator 40 is disabled when the output of the AND gate 60 is "0".

The comparator 40 receives the INPUT signal from the feedback net of the operational amplifier 20 and the voltage reference signal VREF, compares the voltage reference signal VREF and the INPUT signal, and outputs a "1" when the voltage reference signal VREF is greater than the INPUT signal. Further, the comparator 40 outputs a "0" when the voltage reference signal VREF is less than the INPUT signal. The output of the comparator 40 has a pulse 72 of approximately 200 nanoseconds which drives the transistor Q2.

Still referring to FIG. 1, a drain of the transistor Q2 is connected to the output of the operational amplifier 20, a gate of the transistor Q2 is connected to the output of the comparator 40 (e.g., the gate of the transistor Q2 can be driven by the output of the comparator 40), and a source of the transistor Q2 is connected to a drain of the transistor Q4. A source of the transistor Q4 is connected to the low power supply voltage VSS and a gate of the transistor Q4 is connected to a gate of the transistor Q5. A drain of the transistor Q5 is connected to the gate of the transistor Q5 and a source of the transistor Q5 is connected to the low power supply voltage VSS. A source of the transistor Q3 is connected to the high power supply voltage VDD and a drain of the transistor Q3 is connected to the resistor R3. The gate of the transistor Q3 has a pulse 76 of approximately 200 nanoseconds. The resistor R3 is connected between the transistors Q3 and Q5.

Referring to the timing chart 70 depicting timing diagrams of the enabled signal EN, the delayed enabled signal ENB_D, and the pulse signal 72, in operation, for example, the transistors Q2, Q3 act as switches to disconnect the wake-up time circuit 30 during a stable operation (e.g., when the output OUT of the LDO regulator circuit structure 10 goes to a stable voltage of approximately 1.2 volts). In contrast, when the enable signal EN is "1", a gate voltage of the pass transistor Q1 is pulled to the low power supply voltage VSS with the transistors Q2, Q4 by the pulse 72. Therefore, the pass transistor Q1 is turned on quickly during the transient period. In particular, the pass transistor Q1 has a wake-up time which is based on the pulse 72 driving the transistor Q2. In an embodiment, the wake-up time of the pass transistor Q1 is programmable through current injection at the gate of the transistor Q1.

The transistor Q1 turns off by the output of the comparator 40 when the output OUT goes to a stable voltage and the comparator 40 also turns off when using the delayed enabled signal ENB_D. In an embodiment, the output OUT has a feedback loop with the gate of the transistor Q1 such that current injection to the gate of the transistor Q1 is turned off in response to the output OUT reaching the stable voltage. In the operation of FIG. 1, the output OUT reaches the stable voltage (e.g., approximately 1.2 volts) within approximately 360 nanoseconds across process, voltage, and temperature (PVT) corners using the pulse injection method.

Figure 2:
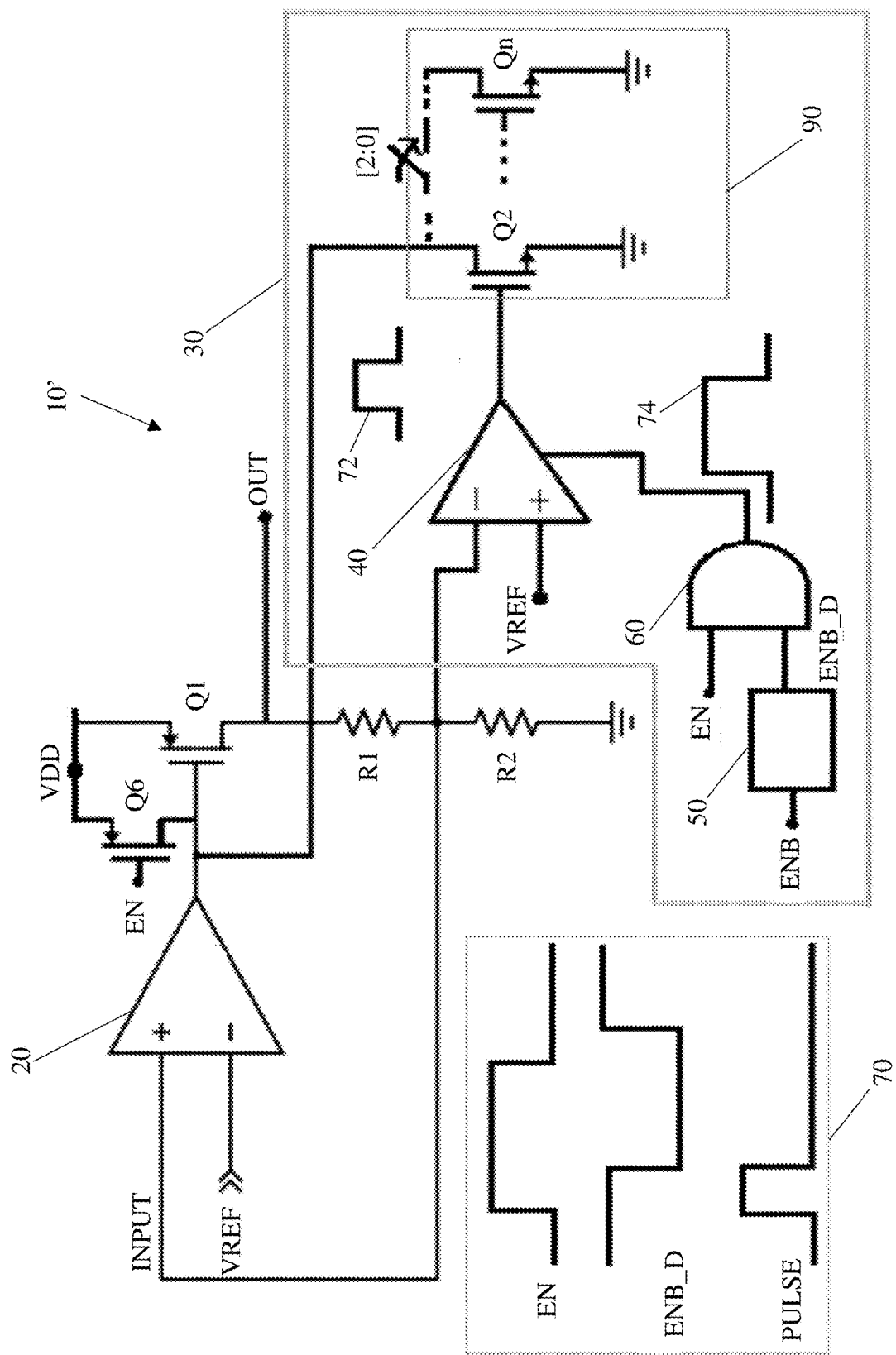
FIG. 2 shows an alternative LDO regulator circuit with the pulse injection method in accordance with aspects of the present disclosure.

FIG. 2 shows an alternative LDO regulator circuit with the pulse injection method in accordance with aspects of the present disclosure. The alternative LDO regulator circuit 10' is similar to the LDO regulator circuit 10, and further includes a trimming circuit 90 connected to the outputs of the comparator 40 instead of the transistors Q3, Q4, Q5. For example, in FIG. 2, the trimming circuit 90 includes transistors Q2, . . . , Qn, in which n is an integer above 2. In embodiments, the trimming circuit 90 is used to select one of the transistors Q3, . . . , Qn to address the process, voltage, and temperature (PVT) variations. Further, the transistor Q2 is connected between the gate of the pass transistor Q1 and the low power supply voltage VSS.

In operation of FIG. 2, the gate of the transistor Q2 is controlled by the output of the comparator 40. The transistor Q2 is programmable (i.e., one of transistors Q3, . . . , Qn is selected) to address the PVT variations using the trimming circuit 90 without affecting the steady state conditions. Further, during the power up time, a gate voltage of the pass transistor Q1 is pulled to the low power supply voltage VSS with the transistor Q2 by the pulse 72. Therefore, the pass transistor Q1 is turned on quickly during the transient period. The pass transistor Q1 is turned off by the pulse 72 when the operation amplifier 20 is ready (e.g., when the output OUT of the alternative LDO regulator circuit 10' reaches the stable voltage). The comparator 40 is also turned off using the enable signal EN. The output OUT of the LDO regulator circuit structure 10' in FIG. 2 reaches the stable voltage (e.g., approximately 1.2 volts) within approximately 360 nanoseconds across process, voltage, and temperature (PVT) corners using the pulse injection method without impacting power and an area size.

Figure 3:
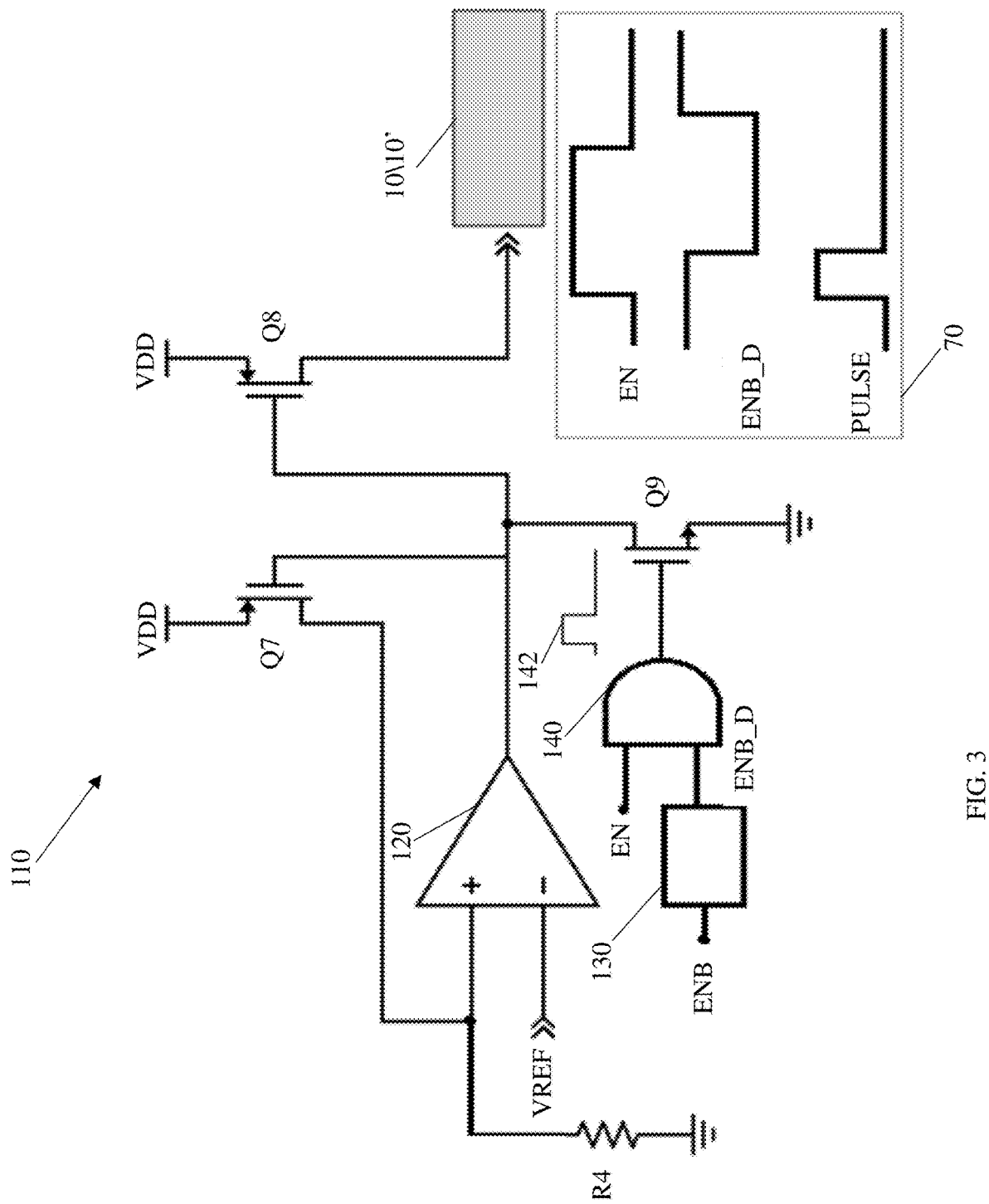
FIG. 3 show a voltage/current (V/I) converter connected to the LDO regulator circuit in accordance with aspects of the present disclosure.

FIG. 3 show a voltage/current (V/I) converter connected to the LDO regulator circuit in accordance with aspects of the present disclosure. In embodiments, a voltage/current (V/I) converter circuit structure 110 of FIG. 3 includes an operational amplifier 120, a delay block 130, an AND gate 140, transistors Q7, Q8, Q9 and resistor R4. In embodiments, the transistors Q7 and Q8 are PMOS transistors and Q9 is a NMOS transistor.

In embodiments, the operational amplifier 120 receives a voltage reference signal VREF and an op-amp signal connected to the resistor R4. The operational amplifier 120 amplifies a difference between the voltage reference signal VREF and the op-amp signal and outputs the amplified difference to a gate of the transistor Q7 and a gate of the transistor Q8. A source of the transistor Q7 is connected to the high voltage power supply VDD and a drain of the transistor Q7 is connected to the op-amp signal. A source of the transistor Q8 is connected to the high voltage power supply VDD and a drain of the transistor Q8 is connected to one of the LDO regulator circuit structure 10 and the alternative LDO regulator circuit 10'.

Still referring to FIG. 3, the delay block 130 receives an enabled signal ENB, delays the enabled signal ENB, and outputs a delayed enabled signal ENB_D to the AND gate 140. The AND gate 140 also receives the enable signal EN. Therefore, the AND gate 140 outputs a "1" when both the delayed enabled signal ENB_D and the enable signal EN are "1". The output of the AND gate 140 has a pulse 142. The output of the AND gate 140 is input to the gate of the transistor Q9. A drain of the transistor Q9 is connected to the output of the operational amplifier 120 and a source of the transistor Q9 is connected to the low power supply voltage VSS.

In operation, a gate of the transistor Q9 is controlled by an initial pulse 142 which is high for approximately 6 nanoseconds when the enable signal EN is enabled. A gate voltage of the pass transistor Q7 is pulled down with the transistor Q9. Therefore, the pass transistor Q7 is turned on quickly during a transient period and provides a bias current quickly to the alternative LDO regulator circuit 10' through the transistor Q8. Therefore, the bias current is generated from the voltage/current (V/I) converter circuit structure 110 to reach a stable current quickly (e.g., approximately 1.25 μsec).

Figure 4:
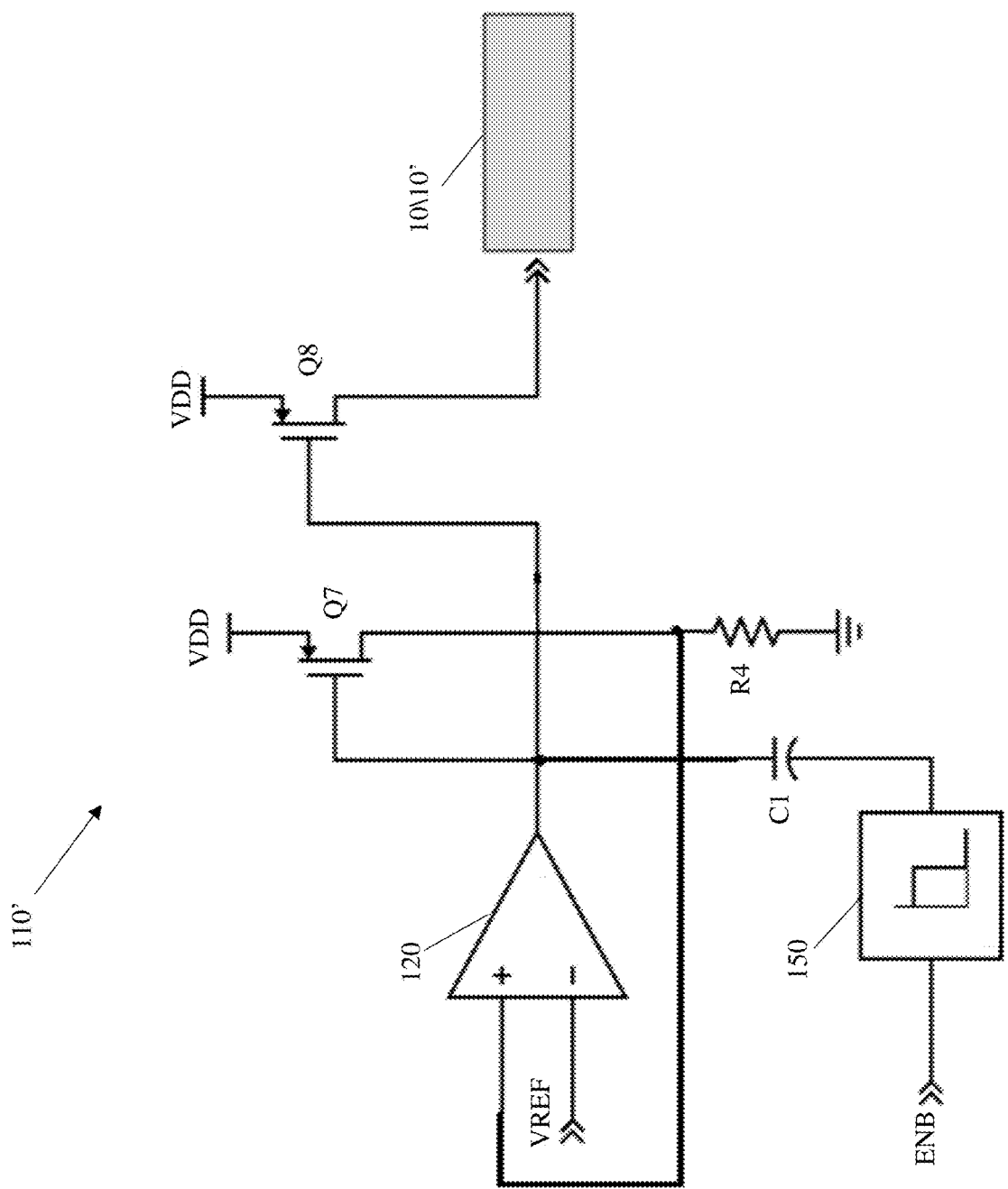
FIG. 4 shows another voltage/current (V/I) converter connected to the LDO regulator circuit in accordance with aspects of the present disclosure.

FIG. 4 shows another voltage/current (V/I) converter connected to the LDO regulator circuit in accordance with aspects of the present disclosure. In embodiments, voltage/current (V/I) converter circuit structure 110' of FIG. 4 includes the operational amplifier 120, an initial pulse 150, transistors Q7, Q8, resistor R4, and a capacitor C1. In embodiments, the transistors Q7, Q8 are PMOS transistors.

In FIG. 4, the operational amplifier 120 receives a voltage reference signal VREF and the op-amp signal connected to the resistor R4. The operational amplifier 120 amplifies a difference between the voltage reference signal VREF and the op-amp signal, and outputs the amplified difference to a gate of the transistor Q7 and a gate of the transistor Q8. A source of the transistor Q7 is connected to the high voltage power supply VDD and a drain of the transistor Q7 is connected to the resistor R4. A source of the transistor Q8 is connected to the high voltage power supply VDD and a drain of the transistor Q8 is connected to one of the LDO regulator circuit structure 10 and the alternative LDO regulator circuit 10'. The initial pulse 150 receives a second enabled signal ENB and outputs a transient pulse to the capacitor C1. The capacitor C1 is connected between the output of the operational amplifier 120 and the transient pulse.

In operation, a cap push method is implemented using the capacitor C1 to improve speed in a transient period. In particular, during the transient period, a gate voltage of the pass transistor Q7 is pulled down with the capacitor C1. Therefore, the pass transistor Q7 is turned on quickly during the transient period and provides a bias current quickly to either the LDO regulator circuit structure 10 or the LDO regulator circuit 10' through the transistor Q8. In this way, the bias current is generated from the voltage/current (V/I) converter circuit structure 110' to reach a stable current quickly (e.g., approximately 1.25 μsec).

The LDO regulator circuit may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a comparator connected to a first transistor of a low drop-out (LDO) circuit, the comparator being enabled by a gate with an enable signal, wherein the first transistor is turned on during a transient period based on a gate voltage of the first transistor being pulled to a low power supply voltage;
    a second transistor connected to a gate of the first transistor and the comparator;
    a feedback loop connected to the first transistor and an output of the LDO circuit; and
    an operational amplifier which amplifies a difference between a voltage reference signal and an input signal from a feedback net of the operational amplifier, and outputting the amplified difference to a gate of a third transistor and a drain of a fourth transistor, with the fourth transistor comprising a gate connected to the enable signal and a source connected to a high power supply voltage VDD.

2. The structure of claim 1, wherein the first transistor and the second transistor are PMOS transistors, a wake-up time of the second transistor is programmable through current injection, and the feedback loop turns off the current injection at the second transistor in response to the output of the LDO circuit reaching a predetermined stable voltage level.

3. The structure of claim 1, wherein the comparator compares the output of the LDO circuit with the voltage reference signal and outputs a pulse to drive the first transistor in response to the voltage reference signal being greater than the output of the LDO circuit.

4. The structure of claim 1, wherein the comparator compares the output of the LDO circuit with a voltage reference signal and outputs "0" to turn off the first transistor in response to the voltage reference signal being less than the output of the LDO circuit.

5. The structure of claim 1, wherein the comparator compares the output of the LDO circuit with a voltage reference signal and outputs "0" to turn off the first transistor in response to a delayed enabled signal and an enabled signal being "1".

6. The structure of claim 1, wherein the first transistor is programmable to address process, voltage, and temperature (PVT) variations by selecting at least one transistor within a trimming circuit.

7. The structure of claim 6, wherein the trimming circuit comprises a plurality of transistors corresponding to different PVT variations.

8. A structure comprising:
a comparator generating a pulse to drive a first transistor by sensing an output of a low drop-out (LDO) circuit, the comparator being enabled by an AND gate with an enable signal and delayed enabled signal, wherein the first transistor is turned on during a transient period based on a gate voltage of the first transistor being pulled to a low power supply voltage;
a second transistor coupled to a gate of the first transistor such that a wake-up time of the second transistor is based on the pulse driving the first transistor, the second transistor further being connected to the comparator; and
an operational amplifier which amplifies a difference between a voltage reference signal and an input signal from a feedback net of the operational amplifier, and outputting the amplified difference to a third transistor and a fourth transistor, the fourth transistor connecting to the enable signal and a high power supply voltage VDD.

9. The structure of claim 8, wherein the second transistor is turned off in response to the output reaching a predetermined stable voltage level.

10. The structure of claim 9, wherein the first transistor and the second transistor comprise PMOS transistors.

11. The structure of claim 10, wherein the comparator compares the output of the LDO circuit with a voltage reference signal and outputs the pulse in response to the voltage reference signal being greater than the output of the LDO circuit.

12. The structure of claim 10, wherein the comparator compares the output of the LDO circuit with a voltage reference signal and outputs "0" to turn off the first transistor in response to the voltage reference signal being less than the output of the LDO circuit.

13. The structure of claim 10, wherein the comparator compares the output of the LDO circuit with a voltage reference signal and outputs "0" to turn off the first transistor in response to the delayed enabled signal and the enabled signal being "1".

14. The structure of claim 8, wherein the first transistor is programmable to address process, voltage, and temperature (PVT) variations by selecting at least one transistor within a trimming circuit.

15. The structure of claim 14, wherein the trimming circuit comprises a plurality of transistors which correspond with different PVT variations.

16. The structure of claim 8, further comprising a voltage/current (V/I) converter providing a bias current to the LDO circuit.

17. The structure of claim 16, wherein the V/I converter provides the bias current to the LDO circuit based on an initial pulse reaching a high level and passing through a gate of another third transistor.

18. The structure of claim 16, wherein the V/I converter provides the bias current to the LDO circuit based on an initial pulse reaching a high level and passing through a capacitor.

19. The structure of claim 8, wherein a drain of the first transistor is directly connected to a gate of the second transistor.

20. A method comprising:
generating a pulse by sensing an output of a low drop-out (LDO) circuit;
driving a first transistor by the generated pulse, wherein the first transistor is turned on during a transient period based on a gate voltage of the first transistor being pulled to a low power supply voltage; and
waking up a second transistor within a wake-up time which is based on the generated pulse driving the first transistor, wherein the second transistor is connected to a comparator, and the comparator is enabled by an AND gate with an enable signal and delayed enabled signal, and outputs the pulse; and
amplifying a difference between a voltage reference signal and a signal received from a feedback net of the LDO circuit, and outputting the amplified difference to the first transistor, a second transistor connected to the enable signal and a third transistor connected to the power supply voltage.

* * * * *